United States Patent [19]

Ema

[11] Patent Number: 5,424,237
[45] Date of Patent: Jun. 13, 1995

[54] METHOD OF PRODUCING SEMICONDUCTOR DEVICE HAVING A SIDE WALL FILM

[75] Inventor: Taiji Ema, Kawasaki, Japan

[73] Assignee: Fujitsu Limited, Kawasaki, Japan

[21] Appl. No.: 159,776

[22] Filed: Dec. 2, 1993

Related U.S. Application Data

[60] Continuation of Ser. No. 825,502, Jan. 24, 1992, abandoned, which is a division of Ser. No. 659,475, Feb. 25, 1991, Pat. No. 5,121,175, which is a continuation of Ser. No. 265,998, Nov. 2, 1988, abandoned.

[30] Foreign Application Priority Data

Nov. 14, 1987 [JP] Japan .................... 62-286461

[51] Int. Cl.⁶ .............. H01L 21/8232; H01L 21/8242
[52] U.S. Cl. .......................... 437/52; 437/43; 437/195; 437/228
[58] Field of Search ............... 437/43, 44, 195, 41, 437/49, 52, 228

[56] References Cited

U.S. PATENT DOCUMENTS

| | | | |
|---|---|---|---|
| 4,313,253 | 2/1982 | Henderson, Sr. | 437/44 |
| 4,356,040 | 10/1982 | Fu et al. | 437/49 |
| 4,535,528 | 8/1985 | Chen et al. | 357/54 |
| 4,577,391 | 3/1986 | Hsia et al. | 437/44 |
| 4,597,824 | 7/1986 | Shinada et al. | 357/41 |
| 4,640,000 | 2/1987 | Sato | 29/571 |
| 4,651,184 | 3/1987 | Malhi | 357/41 |
| 4,710,789 | 12/1987 | Furutani et al. | 357/23.6 |
| 4,754,313 | 6/1988 | Takemae et al. | 357/41 |
| 4,806,201 | 2/1989 | Mitchell et al. | 156/653 |
| 4,807,013 | 2/1989 | Manocha | 357/59 |
| 4,821,085 | 4/1989 | Haken et al. | 357/23.1 |
| 4,826,781 | 5/1989 | Asahima et al. | 357/23.1 |
| 4,835,589 | 5/1989 | Pfiester | 357/23.6 |
| 4,855,246 | 8/1989 | Codella et al. | 437/44 |
| 4,855,248 | 8/1989 | Arizumi et al. | 437/49 |
| 4,870,470 | 9/1989 | Bass, Jr. et al. | 357/54 |
| 4,873,557 | 10/1989 | Kita | 357/23.1 |
| 4,899,203 | 1/1990 | Ino | 357/51 |
| 4,905,064 | 2/1990 | Yabu et al. | 357/51 |
| 4,928,163 | 5/1990 | Yoshida et al. | 357/23.4 |
| 4,949,136 | 8/1990 | Jain | 357/23.3 |
| 4,971,922 | 11/1990 | Watabe et al. | 437/44 |

FOREIGN PATENT DOCUMENTS

| | | | |
|---|---|---|---|
| 0162774 | 11/1985 | European Pat. Off. | |
| 0164186 | 11/1985 | European Pat. Off. | |
| 0191612 | 8/1986 | European Pat. Off. | |
| 0078561 | 5/1984 | Japan | 357/23.6 |
| 0014462 | 1/1985 | Japan | 357/23.6 |
| 0082463 | 4/1986 | Japan | 357/23.6 |
| 0095563 | 5/1986 | Japan | 357/23.6 |
| 0156862 | 7/1986 | Japan | 357/23.6 |
| 0141758 | 6/1987 | Japan | 357/23.6 |
| 62-143473 | 6/1987 | Japan | 357/23.1 |
| 0145859 | 6/1987 | Japan | 357/23.6 |
| 0090853 | 4/1988 | Japan | 357/55 |
| 0174351 | 7/1988 | Japan | 357/23.6 |
| 0182859 | 7/1988 | Japan | 357/41 |
| 1-191474 | 1/1989 | Japan | 357/23.1 |

OTHER PUBLICATIONS

Tsang, P. J., et al., "Fabrication of High–Performance LDDFETs with Oxide Sidwall–Spacer Technology", *IEEE Transactions on Electron Devices*, vol. ED-29, No. 4, Apr. 1982, pp. 590–596.

*Primary Examiner*—T. N. Quach
*Attorney, Agent, or Firm*—Staas & Halsey

[57] ABSTRACT

A semiconductor device includes a semiconductor substrate, an insulation film formed on the semiconductor substrate, a film formed on the insulation film having a side wall, and a side wall film formed on the insulation film so as to surround the side wall of the film. The side wall film has a slope and satisfies a condition a>d, where a is a width of a bottom surface of the side wall film which is in contact with the insulation film, and d is a thickness of the film.

6 Claims, 6 Drawing Sheets

METHOD OF PRODUCING SEMICONDUCTOR DEVICE HAVING A SIDE WALL FILM

This application is a continuation of application Ser. No. 07/825,502, filed Jan. 24, 1992, abandoned, which is a divisional of application Ser. No. 07/659,475, filed Feb. 15, 1991, now U.S. Pat. No. 5,121,175 issued Jun. 9, 1992, and which is a continuation of application Ser. No. 07/265,998, filed Nov. 2, 1988, abandoned.

BACKGROUND OF THE INVENTION

The present invention generally relates to a semiconductor device having a smoothed edge of a layer and a method of producing the same.

Currently, a need exists for finer patterns for fabricating a semiconductor device. Anisotropic etching is suitable to forming finer patterns. For example, a polysilicon film is patterned by anisotropic etching in which an etching gas containing $CCl_4/O_2$ is used. An edge of a side wall of the pattern thus formed is like a sheer cliff. In other words, an edge of the pattern rises sheer from an underlying layer. It is known that overhang portions are sometimes formed at side walls of patterns. As the height of the side wall of a lower layer increases, it becomes difficult to pattern an upper layer which covers the lower layer. It is known that most vertical side walls of layers are coated with spin on glass, or an etch-back process is employed, in order to eliminate the above-mentioned problem. However, such methods lead to an increased number of manufacturing steps. Particularly, it is very difficult to control the etch-back process.

In a dynamic random access memory device (hereinafter simply referred to as a DRAM), reduction in size of a projected area of a memory cell projected on a flat surface is desired. It is known that with a conventional stacked capacitor structure formed in the memory cell area equal to or less than 10 $[\mu^2]$, it is very difficult to obtain a sufficient value of capacitance of a memory cell capacitor. In order to increase capacitance of the memory cell capacitor, it is conceivable to form a thicker storage electrode of polysilicon to thereby increase an area of a side surface of the storage electrode. With this structure, the entire surface area of the memory cell capacitor can be prevented from decreasing. However, it is noted that patterning of a polysilicon film to obtain the storage electrode is greatly affected by a roughness of a surface of an underlying film under the polysilicon film. The polysilicon film used for forming the storage electrode is deposited on an interlayer insulation film which covers gate electrodes. Generally, the surface of the interlayer insulation film has stepped portions, or convex and recessed portions due to the presence of the gate electrodes. The presence of great convex and recessed portions makes it difficult to pattern the polysilicon film deposited on the interlayer insulation film. As a result, a fine pattern of the storage capacitor cannot be obtained.

SUMMARY OF THE INVENTION

It is therefore a general object of the present invention to provide a novel and useful semiconductor device having a side wall film and a method of producing the same, in which the aforementioned disadvantages are eliminated.

A more specific object of the present invention is to provide a semiconductor device in which a side wall film is formed around an edge or side wall of a lower film on which an upper film to be patterned is formed. The presence of the side wall film enables formation of a smoothed edge of the film or a smooth surface of the lower film.

The above objects of the present invention can be achieved from a semiconductor device including a semiconductor substrate, an insulation film formed on the semiconductor substrate, a film formed on the insulation film having a side wall, and a side wall film formed on the insulation film so as to surround the side wall of the film. The side wall film has a slope and satisfies a condition $a > d$ where a is a width of a bottom surface of the side wall film which is in contact with the insulation film and d is a thickness of the film.

Another object of the present invention is to provide a method of producing the above-mentioned semiconductor device.

The above another object of the present invention can be achieved from a method of producing the semiconductor device which comprises the steps of forming a first insulation film on the semiconductor substrate, forming a film on the first insulation film, patterning the film, depositing a second insulation film of silicon dioxide on the entire surface of the substrate; and etching the second insulation film by anisotropic etching until a portion of the second insulation film on a flat surface of the first insulation film is completely removed. A side wall film of a remaining portion of the second insulation film is formed on the insulation film so as to surround the side wall of the film, the side wall film having a slope and satisfying a condition $a > d$ where a is a width of a bottom surface of the side wall film which is in contact with the insulation film and d is a thickness of the film.

Other objects, features and advantages of the present invention will become apparent from the following detailed description when read in conjunction with the accompanying drawings.

DETAILED DESCRIPTION

Figure 1:
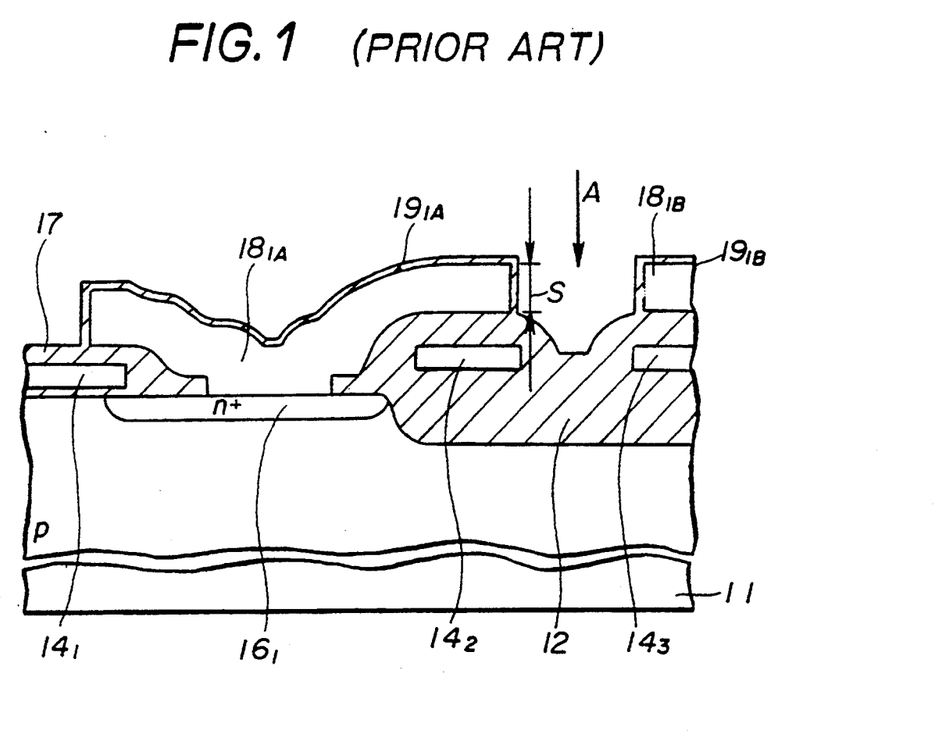
FIG. 1 is a cross sectional view of an essential portion of a conventional semiconductor device to illustrate problems.
Figure 2:
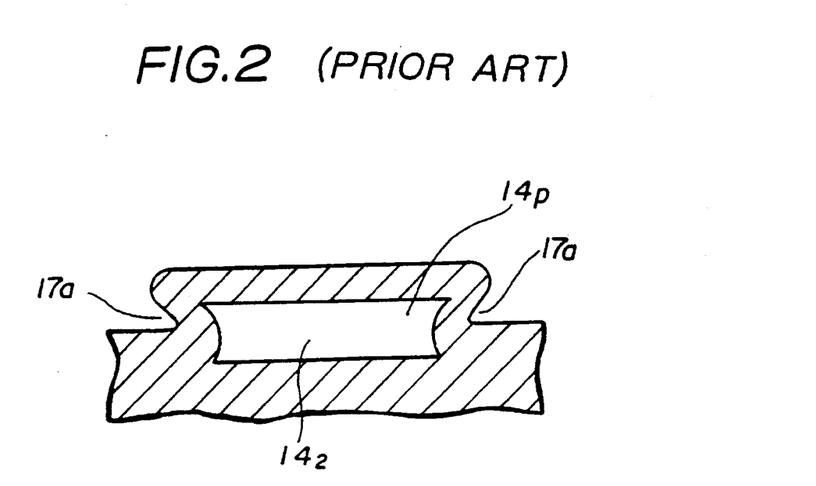
FIG. 2 is a cross sectional view to illustrate another problem of the conventional semiconductor device.

To facilitate the understanding of the present invention, a description is first given of problems caused by the presence of stepped portions of an underlying layer on which a storage capacitor electrode of a DRAM device is formed, with reference to FIGS. 1 and 2.

FIG. 1 shows a cross section of an essential part of a conventional DRAM device. As shown, the DRAM device has a silicon semiconductor layer 11, a field insulation film 12 formed on top of the substrate 11, gate electrodes $14_1$, $14_2$ and $14_3$, and an interlayer insulation film 17 formed so as to cover the gate electrodes $14_1$, $14_2$ and $14_3$. An $n^+$-type diffusion region $16_1$, which is a storage capacitor contact region, is formed in the substrate 11. A storage electrode $18_{1A}$ is formed on the interlayer insulation film 17 having a contact hole through which the storage electrode $18_{1A}$ is in contact with the n+-type diffusion region $16_1$. The storage electrode $18_{1A}$ is one electrode out of paired electrodes of a memory cell capacitor. A dielectric film $19_{1A}$ such as a silicon dioxide film is formed so as to surround an exposed surface of the storage electrode $18_{1A}$. The other electrode (not shown) out of the paired electrodes (called an opposed electrode or cell plate) is formed on the dielectric film $19_{1A}$.

As described hereinbefore, as the projected area of the surface of the memory cell projected onto a flat surface decreases, the projected area of the surface of the memory cell capacitor decreases. Thereby capacitance of the memory cell capacitor also decreases. In order to compensate the decrease of capacitance, it is conceivable to approximately double the thickness S of the storage electrode $18_{1A}$ (about 0.5 [μm]). Thereby the area of a side wall of the storage electrode $18_{1A}$ increases, and a decrease of the entire surface of the storage electrode $18_{1A}$ can be prevented.

However, the thick storage electrode $18_{1A}$ produces a great stepped portion as indicated by an arrow A. As shown, between the gate electrodes $18_{1A}$ and $18_{1B}$, there is formed a deep recess due to the presence of the gate electrodes $14_2$ and $14_3$ which have side walls rising sheer. Therefore, it is difficult to pattern the polysilicon film by photolithography technology to form the storage electrodes $18_{1A}$ and $18_{1B}$. In addition, as shown in FIG. 2, an overhang portion $14p$ is often formed at the edge of the gate electrode $14_2$. In this case, the interlayer insulation film 17 deposited on the gate electrode $14_2$ has a shape shown in FIG. 2. It is noted that a concave portion $17a$ is formed on the side surface of the interlayer insulation film 17. The presence of the overhang portion at the edge of the gate electrode $14_2$ also prevents fine patterning of the polysilicon film for the storage electrode $18_{1A}$.

The present invention intends to form a side wall film so as to surround an edge or a side wall of a film such as a gate electrode film and provide a smoothed edge or side wall of the film. With the side wall film, it becomes possible to pattern a thick film by the conventional photolithography technology.

Figure 3:
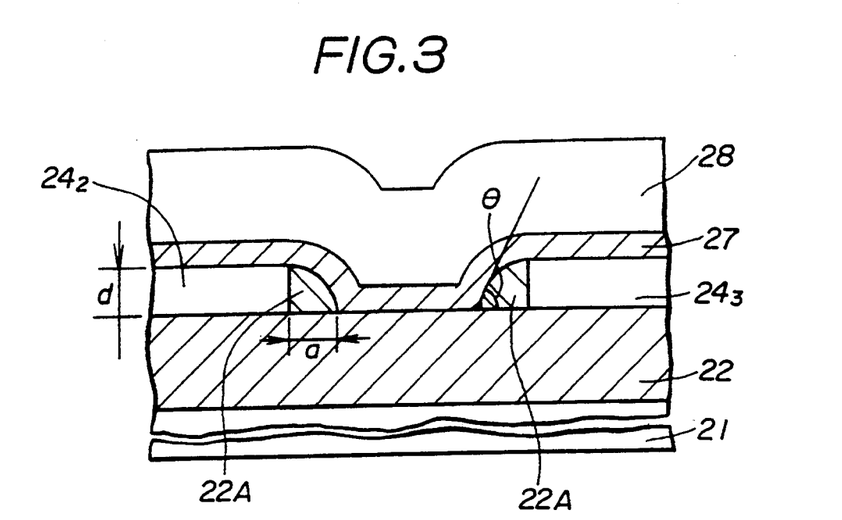
FIG. 3 is a view to illustrate the principle of the present invention.

A description is given of an essential feature of the present invention with reference to FIG. 3.

A field insulation film 22 is formed on a silicon semiconductor substrate 21. Gate electrodes $24_2$ and $24_3$ which function as word lines are formed on the field insulation film 22. Side walls of the gate electrodes $24_2$ and $24_3$ rise sheer from the field insulation film 22. Side wall films 22A are formed so as to surround the edges of the gate electrodes $24_2$ and $24_3$. The side wall films 22A provide slopes between top surfaces of the gate electrodes $24_2$ and $24_3$ and the field insulation film 22. An interlayer insulation film 27 is formed so as to cover the gate electrodes $24_2$ and $24_3$, the side wall films 22A, and an exposed surface on the field insulation film 22. A storage electrode 28 of a polysilicon film is formed on the interlayer insulation film 27.

The present inventor found from many experiments that a particular condition on size of the side wall film 22A providing a slope is required to pattern the polysilicon film 28 by the conventional photolithography technology even if it is thick (0.5 [μm], for example). The particular condition found by the experiments is that the width a of a bottom surface of the side wall film 12A which is in contact with the surface of the field insulation film 22, must be greater than the thickness d of the gate electrode $24_2$. In the experiments, the side wall film 22A in conformity of the above condition was formed. Next the interlayer insulation film 27 was deposited to a thickness of about 1000 [Å], which is enough to withstand a voltage required in conventional DRAM devices. Then the thick polysilicon film 28 having a thickness of about 0.5 [μm] was formed. Finally, the thick polysilicon film 28 was subjected to patterning. The inventor found that a fine polysilicon pattern can be formed with a high accuracy by the conventional photolithography technology.

It was also found from the experiments that in addition to the aforementioned condition, namely a>d, the following condition is advantageous particularly to a thicker polysilicon film having a thickness of more than around 0.5 [μm]. In FIG. 3, an angle $\theta$ is defined at which a lower end portion of the side wall film 22A and the surface of the field insulation film meet. It was found that in a case when the angle $\theta$ is equal to or less than 60°, the thicker polysilicon film can be well patterned by the conventional photolithography technology to thereby form fine polysilicon film.

A description is given of a preferred embodiment of the present invention with reference to FIGS. 4 through 11, which show cross sections of a portion of a DRAM device at respective essential manufacturing steps.

Figure 4:
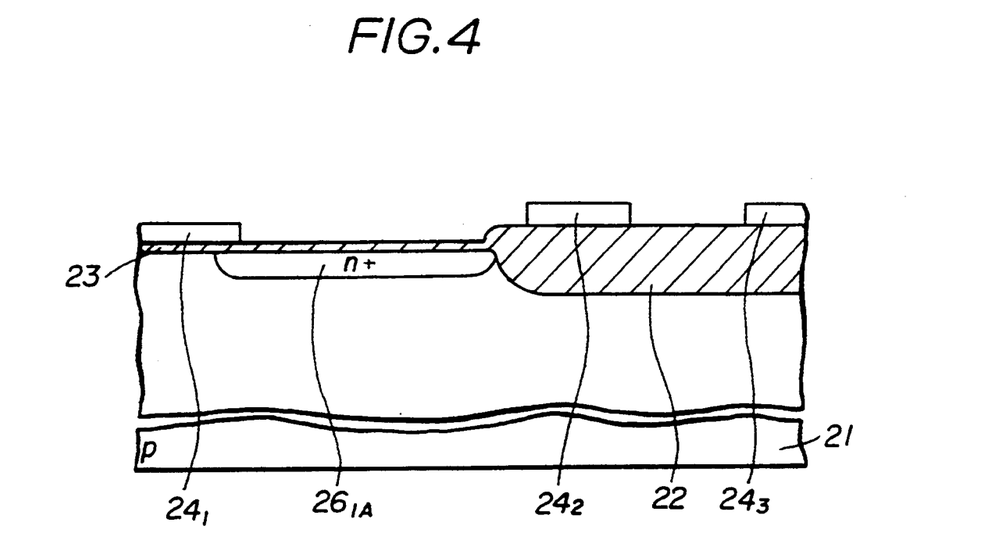
FIGS. 4 through 10 are cross sectional views of dynamic random access memory device of the present invention at essential manufacturing steps.

Referring to FIG. 4, the field insulation film 22 of silicon dioxide is formed on a surface of the p-type silicon semiconductor substrate 21 by selective thermal oxidation such as the local oxidation technique (LOCOS process). In the selective thermal oxidation process, a heat-resistant mask film is used which consists of a silicon dioxide film and a silicon nitride film which are stacked in this sequence. Next the heat-resistant mask film is removed so that a portion of the silicon substrate 21, or an active region is exposed. Then the silicon substrate 21 is subjected to thermal oxidation. Thereby a gate insulation film 23 having a thickness of approximately 200 [Å] is formed as shown in FIG. 4. After that, a polysilicon film is grown to a thickness of about 2000 [Å] by chemical vapor deposition (CVD). Then a mask film is deposited by a resist process in the photolithography technology, and the polysilicon film is patterned by reactive ion etching in which an etching gas of $CCl_4/O_2$ is used. Thereby, gate electrodes $24_1$, $24_2$ and $24_3$ are formed as shown in FIG. 4. Then arsenic (As) ions are implanted in the silicon substrate 21 by ion implantation based on a self-alignment process in which the gate electrodes $24_1$–$24_3$ are used as mask films. Thereby an n+-type source region (not shown) and an n+-type drain region $26_{1A}$ are formed in the substrate 21. At this time, the gate electrodes $24_1$–$24_3$ and other metallization films (not shown) are also doped with arsenic ions.

Figure 5:
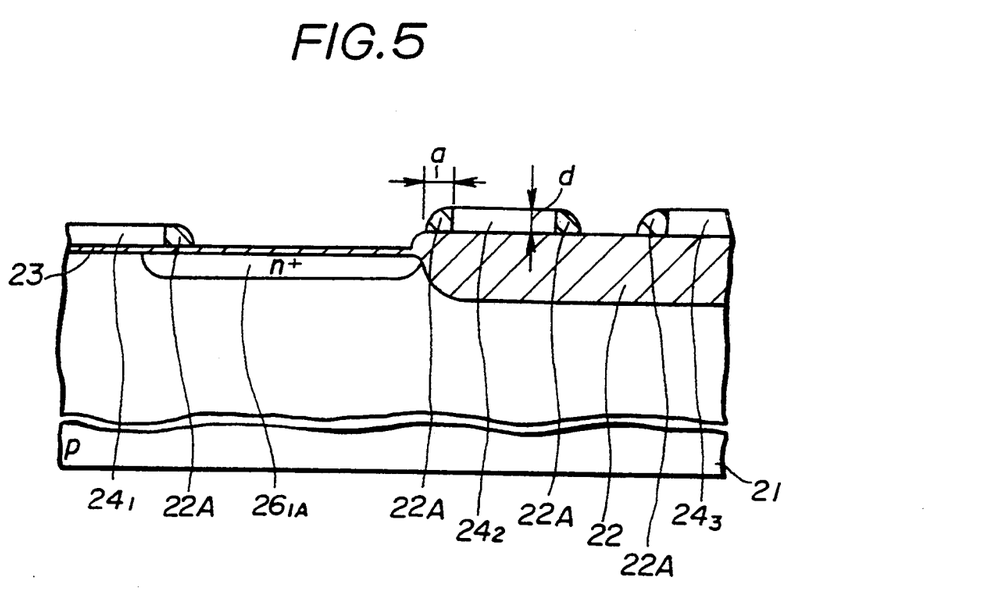

Referring to FIG. 5, a silicon dioxide film is grown to a thickness of approximately 3000 [Å] by chemical vapor deposition. Then the silicon dioxide film is subjected to anisotropic etching by using reactive ion etching in which an etching gas of $CHF_3+H_2$ is used. This anisotropic etching process is carried out until portions of the silicon dioxide film formed on flat surfaces of the gate insulation film 23 and the field insulation film 22, are completely removed. Even after etching, the side wall films 22A remain which surround side walls of the gate electrodes $24_1$–$24_3$ and which have slopes like arcs.

Each side wall film 22A satisfies the aforementioned condition, a>d. The side wall films 22A are approximately 2400 [Å] wide, and are approximately 2000 [Å] thick.

Figure 6:
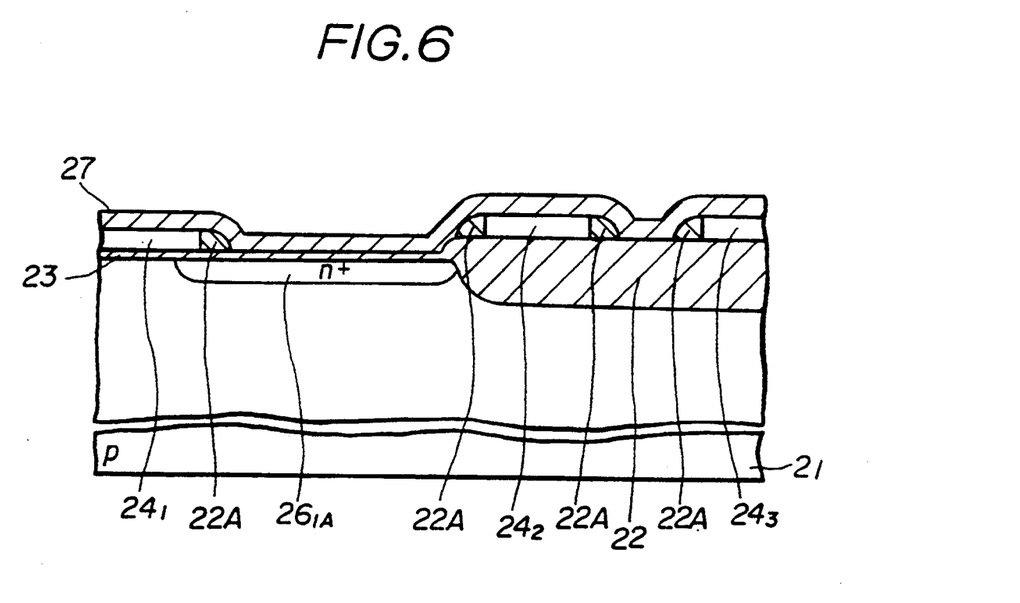

Referring to FIG. 6, the interlayer insulation film 27 of silicon dioxide is grown to a thickness of approximately 1000 [Å] by chemical vapor deposition.

Figure 7:
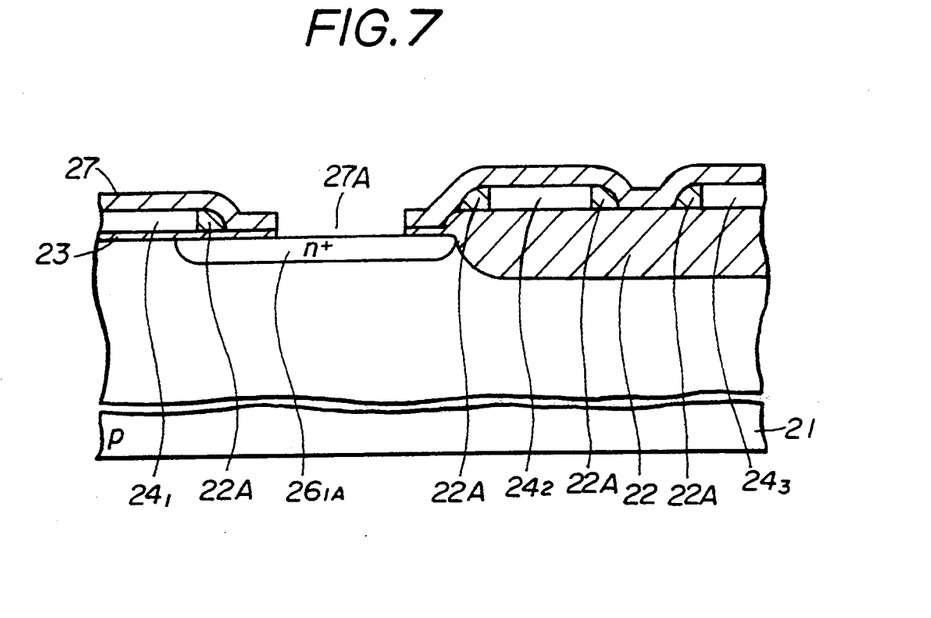

Referring to FIG. 7, the interlayer insulation film 27 and the gate insulation film 23 are subjected to selective etching by the conventional photolithography technology. Thereby a contact window 27A is formed so as to expose a portion of the drain region $26_{1A}$ in the silicon substrate 21.

Figure 8:
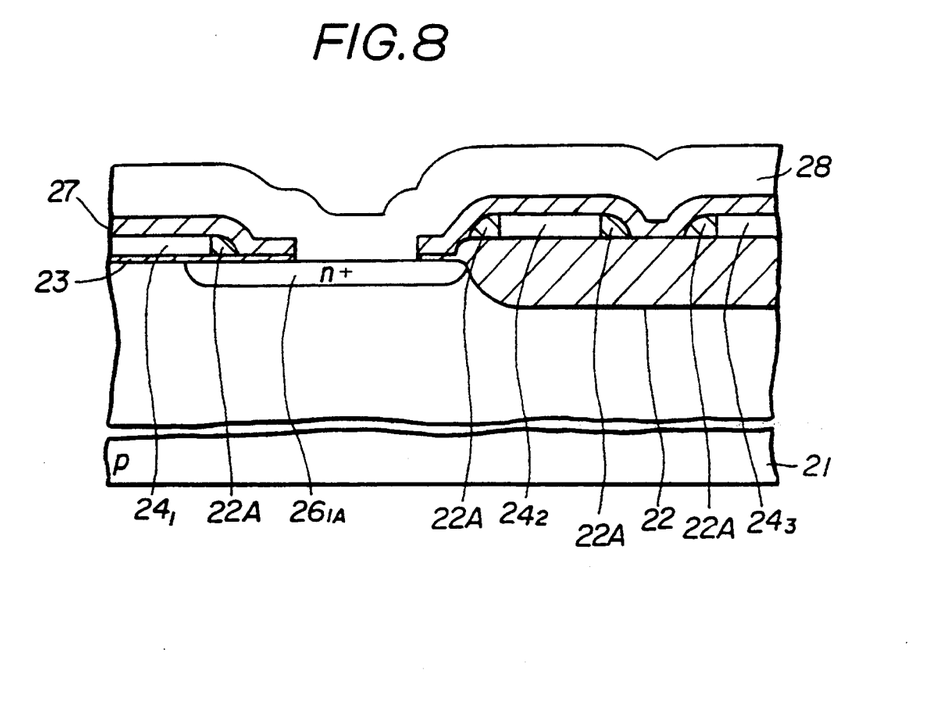

Referring to FIG. 8, the polysilicon film 28 is grown to a thickness of about 0.5 [μm] by chemical vapor deposition. Then arsenic ions are implanted into the polysilicon film 28 by the ion implantation process. With the ion implantation, the polysilicon film 28 is changed to an $n^+$-type conductive film.

Figure 9:
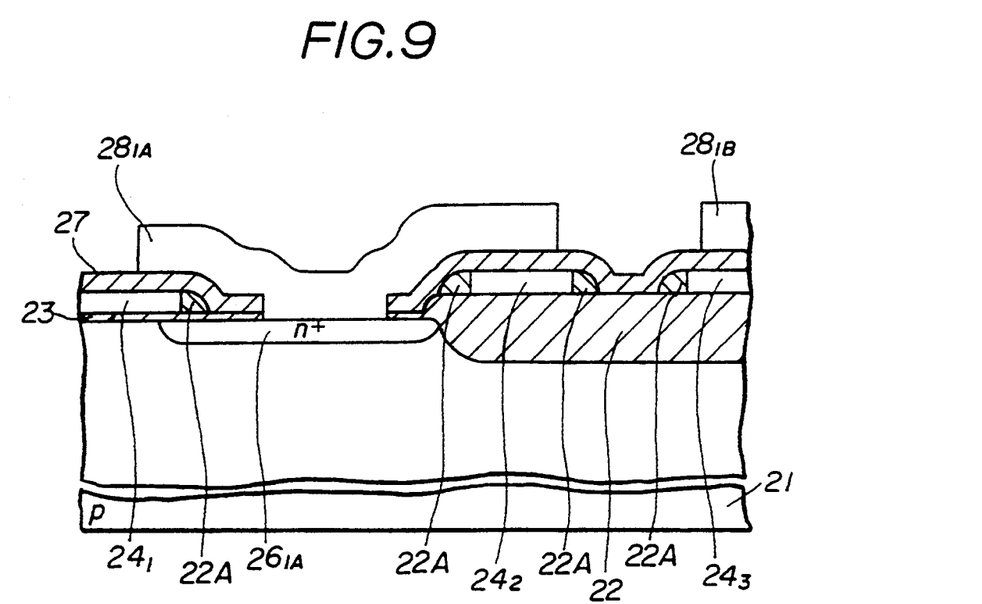

Referring to FIG. 9, a mask film is deposited by the conventional resist process, and the polysilicon film 28 is subjected to the patterning process based on reactive ion etching in which an etching gas of $CCl_4/O_2$ is used. Thereby, storage electrodes $28_{1A}$ and $28_{1B}$ are formed. Each of the storage electrodes thus formed is one electrode out of paired electrodes of a memory cell capacitor. The projected area of the surface of each storage electrode projected onto a flat surface is almost identical to the total area of the side surfaces thereof. In a case where the projected area of the memory cell is equal to or less than 10 [μm$^2$], the storage electrode $28_{1A}$ having the entire surface equal to or greater than 7 [μm$^2$] is obtainable.

Figure 10:
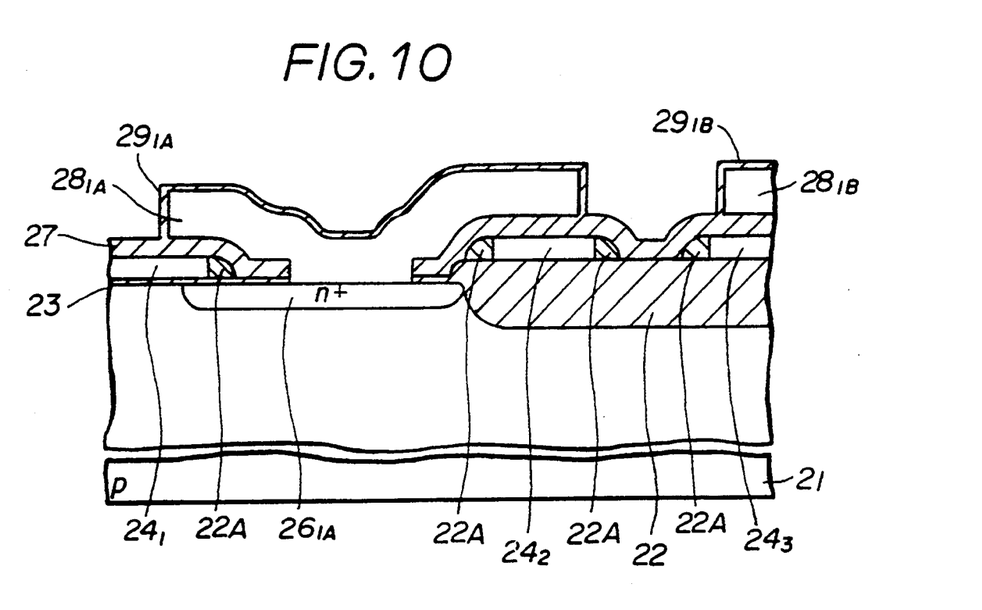

Referring to FIG. 10, dielectric films $29_{1A}$ and $29_{1B}$ each having a thickness of approximately 100 [Å] are formed on exposed surfaces of the storage electrodes $28_{1A}$ and $28_{1B}$, respectively by the thermal oxidation process in which the silicon substrate 21 is placed in a wet atmosphere.

Figure 11:
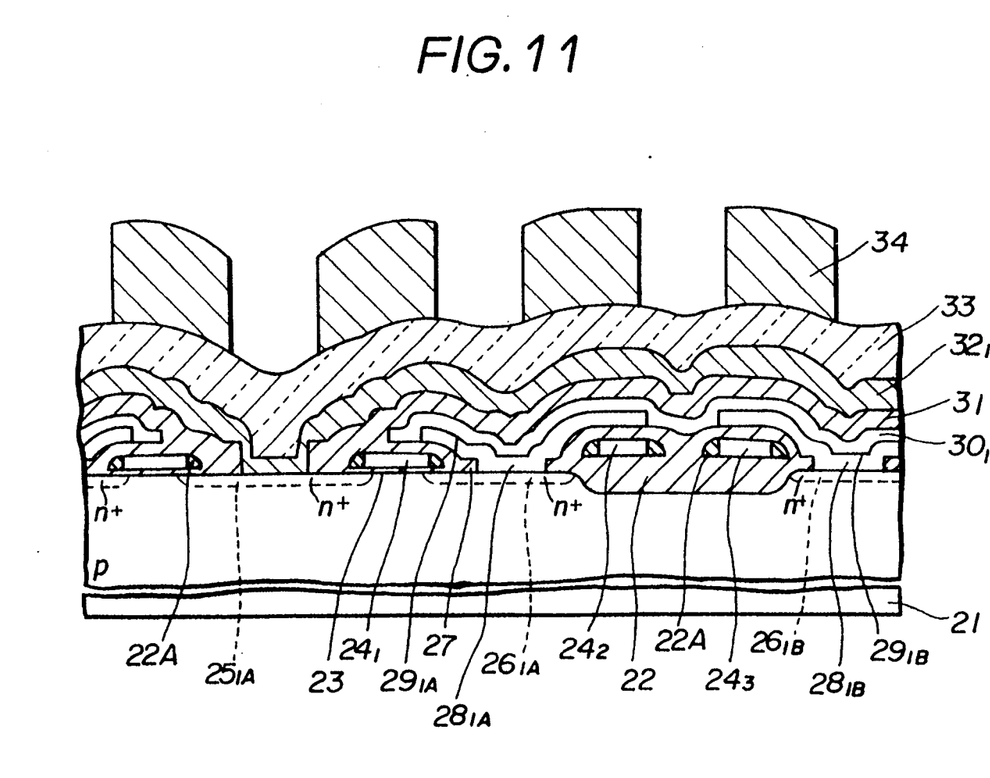
FIG. 11 is a cross sectional view of the DRAM device of the present invention.

Referring to FIG. 11, by any suitable technique, opposed electrodes $30_1$ of polysilicon (called cell plates), an interlayer insulation film 31 of silicon dioxide, bit lines 32 of polycide, a passivation film 33 of phosphosilicate glass (PSG), and metallization films 34 which function as word lines are formed.

In the DRAM device thus formed, a transfer gate transistor of one memory cell is formed by the gate electrode $24_1$, the source region $25_{1A}$ and the drain region $26_{1A}$. A memory cell capacitor is formed by the storage electrode $28_{1A}$, the dielectric film $29_{1A}$ and the opposed electrode $30_1$. The storage electrode $28_{1A}$ is in contact with the drain region $26_{1A}$, and thereby the transfer gate transistor and the memory cell capacitor are mutually connected. An information charge is written into and read out from the memory cell and is stored by controlling the ON/OFF state of the transfer gate.

The present invention is not limited to the aforementioned embodiment, and variations and modifications may be made without departing from the scope of the present invention.

What is claimed is:

1. A process of producing a semiconductor device comprising the steps of:
    forming a first insulation film on a semiconductor substrate;
    forming an electrode on the first insulation film;
    patterning the electrode so that the electrode has a side wall which is perpendicular to the surface of the first insulation film;
    depositing a second insulation film of silicon dioxide on the entire surface of the substrate;
    etching the second insulation film until a portion of the second insulation film on a flat surface of the first insulation film is removed, so that a remaining portion of the second insulation film is formed as a side wall film covering the side wall of the electrode, the side wall film having a slope and satisfying a condition a>d, where a is a width of a bottom surface of the side wall film which is in contact with the first insulation film and d is a thickness of the electrode;
    forming a third insulation film on the electrode, the first insulation film and the side wall film;
    forming a conductive layer on the third insulation film; and
    patterning the conductive layer so that an edge of the conductive layer is positioned above the electrode and is electrically isolated from the electrode by the third insulation film.

2. A method as claimed in claim 1, wherein said step of patterning the second insulation film is carried out by anisotropic etching.

3. A process for producing a semiconductor device comprising the steps of:
    forming a first insulation film on a semiconductor substrate, the first insulation film having a surface;
    forming an electrode on the first insulation film;
    patterning the electrode so that the electrode has a side wall which is perpendicular to the surface of the first insulation film;
    depositing a second insulation film on the electrode and the exposed portions of the first insulation film;
    etching the second insulation film until a portion of the second insulation film is removed, so that a remaining portion of the second insulation film is formed as a side wall film covering the side wall of the electrode, the side wall film having a slope and satisfying a condition a>d, where a is a width of the bottom surface of the side wall film which is in contact with the first insulation film and d is a thickness of the electrode;
    forming a third insulation film on the electrode, the side wall film and the first insulation film;
    forming a conductive layer on the third insulation film; and
    patterning the conductive layer so that an edge of the conductive layer is positioned above the electrode and is electrically isolated from the electrode by the third insulation film.

4. A process for producing a semiconductor device as claimed in claim 3, wherein said etching step comprises etching the second insulation film by using anisotropic etching.

5. A process for producing a dynamic random access memory device including a plurality of DRAM cells respectively including transfer gate transistors and capacitors, said process comprising the steps of:
    (a) forming first electrodes functioning as gate electrodes of the transfer gate transistors and word lines, each of the first electrodes having a side wall;
    (b) forming side wall films so as to cover the side walls of the first electrodes, each of the side wall films having a slope and satisfying a condition a>d where a is a width of a bottom surface of each of the side wall films and d is a thickness of the first electrodes;

(c) forming an insulator film covering the first electrodes and the side wall films;

(d) forming, in the insulator film, openings for connecting storage electrodes of the capacitors to a semiconductor substrate;

(e) forming a conductive film on the insulator film;

(f) patterning the conductive film to define the storage electrodes, first edges of the storage electrodes overlapping above the gate electrodes of the corresponding DRAM cells.

6. The process as claimed in claim 5, wherein:
the word lines extend on field insulating films; and
second edges of the storage electrodes overlap with the word lines.

* * * * *